(12) United States Patent
Tsukamoto

(10) Patent No.: US 6,888,245 B2
(45) Date of Patent: May 3, 2005

(54) SEMICONDUCTOR DEVICE

(75) Inventor: Kazuhiro Tsukamoto, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/222,814

(22) Filed: Aug. 19, 2002

(65) Prior Publication Data

US 2003/0057562 A1 Mar. 27, 2003

(30) Foreign Application Priority Data

Sep. 27, 2001 (JP) .......................................... 2001-297499

(51) Int. Cl.⁷ ............................................. H01L 29/40
(52) U.S. Cl. ........................ 257/751; 257/740; 257/745; 257/774
(58) Field of Search ................ 257/751, 774, 257/745, 740

(56) References Cited

U.S. PATENT DOCUMENTS

| | | | |
|---|---|---|---|
| 5,512,516 A | | 4/1996 | Nishida et al. |
| 6,121,134 A | * | 9/2000 | Burton et al. ............... 438/652 |
| 6,150,249 A | * | 11/2000 | Lee et al. .................. 438/592 |
| 6,686,619 B2 | * | 2/2004 | Nakamura et al. .......... 257/297 |

FOREIGN PATENT DOCUMENTS

| | | |
|---|---|---|
| JP | 62095869 | * 5/1987 |
| JP | 4-320329 | 11/1992 |
| KR | 2001-39174 | 5/2001 |

* cited by examiner

*Primary Examiner*—Nathan J Flynn
*Assistant Examiner*—Leonardo Andújar
(74) *Attorney, Agent, or Firm*—Burns, Doane, Swecker & Mathis, L.L.P.

(57) ABSTRACT

A semiconductor device includes a conductive layer formed on a silicon semiconductor substrate, cobalt silicide films formed in a surface layer of the conductive layer, an interlayer insulating film which covers the silicon semiconductor substrate thereabove, and a barrier metal film and a tungsten film which fill in a contact hole formed in the interlayer insulating film and is electrically connected to the cobalt silicide film. The positions of lower surfaces of the cobalt silicide films at the bottom of the contact hole are set lower than the position of a lower surface of the cobalt silicide film provided outside the contact hole. A cobalt silicide film having a necessary thickness can be ensured at the bottom of the contact hole. Further, a contact resistance can be reduced and a junction leak can be suppressed.

10 Claims, 8 Drawing Sheets

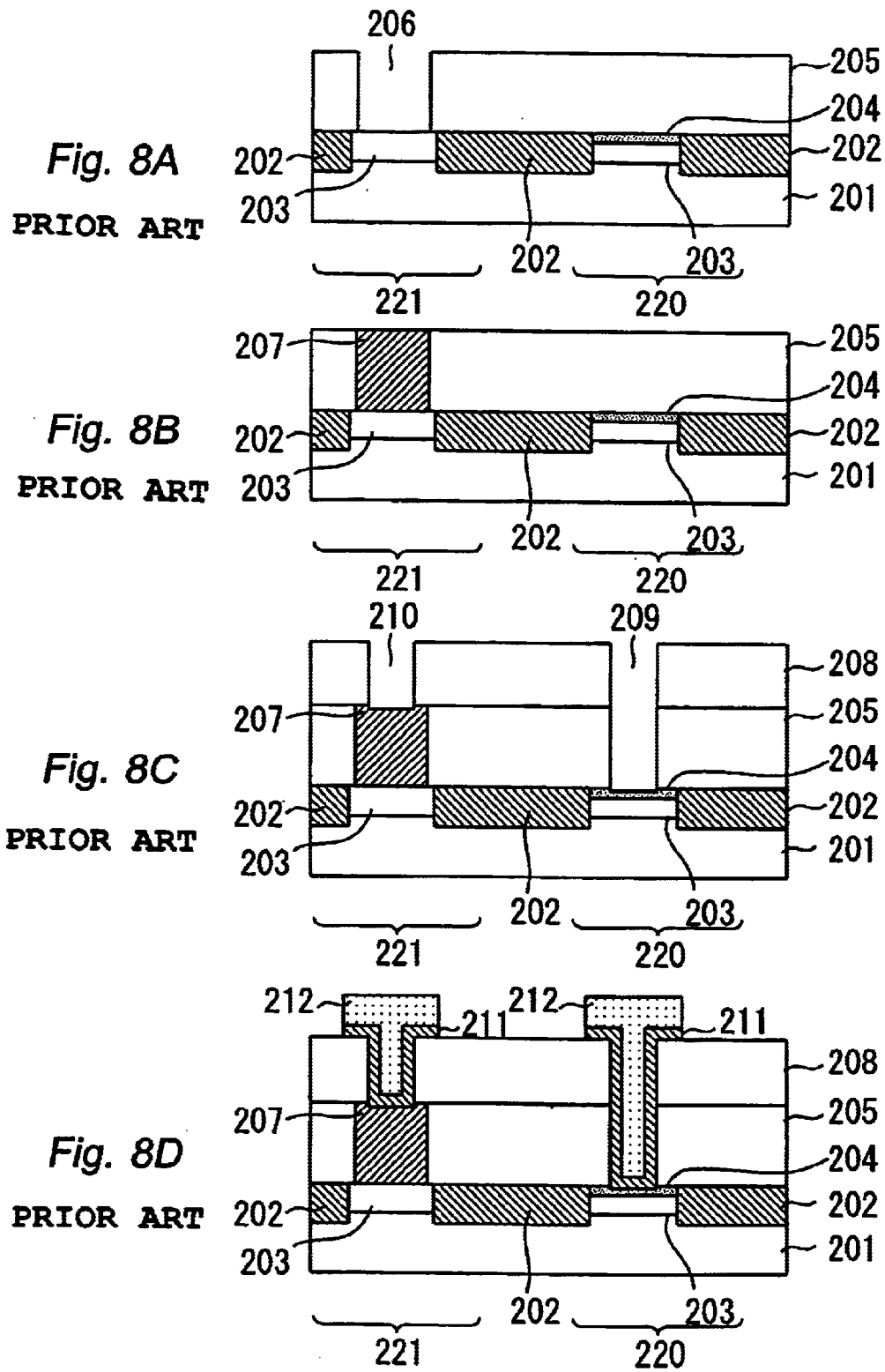

us 6,888,245 B2

1

SEMICONDUCTOR DEVICE

BACKGROUND OF THE INVENTION

1. Field of the Invention

The present invention relates to a semiconductor device, and particularly to a semiconductor device provided with a contact plug layer connected to a semiconductor substrate and a pad electrode.

2. Background Art

In a manufacturing process of a semiconductor device, a barrier metal film for prevention of diffusion is provided at a portion at which different conductive materials are brought into contact with one another, such as a connecting portion between a semiconductor substrate and a contact layer.

A method of manufacturing a conventional semiconductor device provided with a barrier metal film will be described with reference to FIGS. 7A to 7C. FIGS. 7A to 7C show a method of forming a contact plug connected to a source/drain diffusion layer of a MOS transistor, for example. A description of a process for forming a gate oxide film and a gate electrode on an active region will be omitted herein for simplicity. As shown in FIG. 7A, element isolation regions 102 are first formed on a silicon semiconductor substrate 101 by the so-called shallow trench isolation method. Next, a conductive layer 103 composed an impurity of conductivity type opposite to the silicon semiconductor substrate 101 is formed on the silicon semiconductor substrate 101. A normally-used cobalt silicide film 104 is formed on the conductive layer 103 as a contact layer. The conductive layer 103 serves as a source/drain diffusion layer. Thereafter, an interlayer insulating film 105 is formed over the whole surface of the silicon semiconductor substrate 101 by a CVD method.

Next, as shown in FIG. 7B, the interlayer insulating film 105 is selectively etched to form a contact hole 106.

Next, as shown in FIG. 7C, deposition based on an inorganic CVD method using titanium tetrachloride (TiCl$_4$) is done under the condition of temperatures ranging from about 400° C. to about 600° C. to form a titanium film and a titanium nitride film in this order from a lower layer, thereby forming a barrier metal film 107 comprising a laminated film of these two films. Afterwards, a tungsten film 108 is formed by a CVD method using tungsten fluoride (WF$_6$) and an upper wiring formed of the barrier metal layer 107 and the tungsten film 108 is patterned on the interlayer insulating film 105.

FIGS. 8A to 8D are a schematic cross-sectional view showing a method of manufacturing another conventional semiconductor device. The semiconductor device is one in which a DRAM and a logic circuit are combined on the same substrate.

A DRAM-logic combined device is normally configured such that a silicide film is formed on an active region in a logic area to achieve high performance of a transistor, and no silicide film is formed on the active region in a DRAM cell area to reduce a junction leak.

In a DRAM cell area as shown in FIG. 8, a silicon plug (pad electrode) formed of a polycrystalline silicon film is formed on a source/drain diffusion layer of a transistor when the transistor and a bit line are connected to each other, and the silicon plug and the bit line formed thereabove are connected to each other. The method of manufacturing the semiconductor device, which is shown in FIGS. 8A to 8D, will be explained below. Incidentally, a description about a process step for forming a gate oxide film and a gate electrode on an active region will be omitted even in FIGS. 8A to 8D.

As shown in FIG. 8A, element isolation regions 202 are first formed on a silicon semiconductor substrate 201 by the so-called shallow trench isolation method. Next, a conductive layer 203 composed of an impurity of conductivity type opposite to the silicon semiconductor substrate 201 is formed on the silicon semiconductor substrate 201. The conductive layer 203 serves as a source/drain diffusion layer. In a logic area 220, a general cobalt silicide film 204 is formed on the conductive layer 203 as a contact layer. Thereafter, an interlayer insulating film 205 is formed over the whole surface of the silicon semiconductor substrate 201. In a DRAM cell area 221, part of the interlayer insulating film 205 is selectively etched to form a contact hole 206.

Next, as shown in FIG. 8B, a polycrystalline silicon film containing an impurity of the same conductivity type as the conductive film 203 is formed on the silicon semiconductor substrate 201 by a CVD method. The polycrystalline silicon film is removed on the interlayer insulating film 205 by etchback or a CMP method, whereby a silicon plug (silicon pad) 207 is formed.

Next, as shown in FIG. 8C, an interlayer insulating film 208 is further formed on the interlayer insulating film 205 by the CVD method. Contact holes 209 and 210 are simultaneously formed on the logic area 220 and the DRAM cell area 221.

Next, as shown in FIG. 8D, deposition based on an inorganic CVD method using titanium tetrachloride is done under the condition of temperatures ranging from about 400° C. to about 600° C. to form a titanium film and a titanium nitride film on the silicon semiconductor substrate 201 in this order from a lower layer, thereby forming a barrier metal film 211 comprising a laminated film of these two films. Afterwards, a tungsten film 212 is formed by a CVD method using tungsten fluoride and an upper wiring formed of the barrier metal film 211 and the tungsten film 212 is patterned on the interlayer insulating film 208.

However, the above-described conventional semiconductor device has caused such problems as shown below. The semiconductor device shown in FIGS. 7A to 7C is accompanied by a problem that the cobalt silicide film 104 at the bottom of the contact hole 106 is etched by etching at the formation of the contact hole 106, so that the thickness of the cobalt silicide film 104 at the bottom of the contact hole 106 becomes thinner than a region other than it. Further, a problem arises in that when the amount of overetching at the formation of the contact hole 106 increases, the contact hole 106 extends through the cobalt silicide film 104 to reach the conductive layer 103 located therebelow.

Therefore, a problem arises in that a contact resistance between the upper wring formed of the barrier metal film 107 and the tungsten film 108, and the cobalt silicide film 104 placed therebelow increases, thus degrading an electric characteristic. On the other hand, another problem arises in that when the thickness of the cobalt silicide film 104 is made thick to prevent an increase in contact resistance, a junction leak is degraded.

In the semiconductor device shown in FIGS. 8A to 8D, a bit line electrically connected to the conductive layer 203 needs to have a contact resistance stable over both the silicide film 204 in the logic area 220 and the silicon plug 207 in the DRAM cell area 221. With high integration of a recent semiconductor device, however, an aspect ratio of a contact hole increases and a coverage property is poor upon deposition based on a sputtering method. Therefore, the stabilization of the contact resistance on the silicide film 204 in the deep contact hole 209 falls into difficulties.

On the other hand, in order to improve the coverage property of the barrier metal film 211, the barrier metal film 211 has been deposited by the inorganic CVD method using titanium tetrachloride under the condition of temperatures ranging from about 400° C. to about 600° C. as described above. This method is accompanied by a drawback that although a contact characteristic at the bottom of the deep contact hole 209 in the logic area 220 can be improved, the contact hole 210 on the silicon plug 207 will cause a new problem.

This problem results in a problem that when the barrier metal film 211 is deposited or grown by the inorganic CVD method using titanium tetrachloride under the condition of temperatures ranging from about 400° C. to about 600° C., the silicon pad 207 and the barrier metal film 211 react with each other simultaneously with the deposition of the barrier metal film 211 to thereby cause missing of polycrystalline silicon constituting the silicon plug 207 directly below the contact hole 210, whereby the contact hole 210 is rendered open. This phenomenon depends on the thickness of the barrier metal film 211. The more the barrier metal film 211 becomes thick, the more the problem arises pronouncedly.

SUMMARY OF THE INVENTION

The present invention has been made to solve the above problems. A first object of the present invention is to provide a semiconductor device provided with a contact layer, which is capable of reducing a contact resistance and suppressing a junction leak.

A second object of the present invention is to stabilize a contact resistance in a logic area and prevent a contact from being open in a DRAM area, in a semiconductor device having a DRAM and logic mixed together.

According to one aspect of the present invention, a semiconductor device includes a first impurity diffusion layer, a first low resistance film, an insulating film, and a first conductive film. The first impurity diffusion layer is formed in a surface layer of a semiconductor substrate. The first low resistance film is formed in a surface layer of the first impurity diffusion layer. The insulating film covers the semiconductor substrate. The first conductive film fills in a first opening formed in the insulating film and is electrically connected to the first low resistance film. The position of a lower surface of the first low resistance film at the bottom of the first opening is lower than the position of a lower surface of the first low resistance film provided outside the first opening.

According to a semiconductor device of the present invention, the position of a lower surface of a first low resistance film at the bottom of a first opening is set lower than the position of a lower surface of the first low resistance film provided outside the first opening. Thus, even if overetching occurs upon etching of the first opening, the first low resistance film having a necessary thickness can be left at the bottom of the first opening. Consequently, a contact resistance in the first opening can be reduced.

Other and further objects, features and advantages of the invention will appear more fully from the following description.

BRIEF DESCRIPTION OF THE DRAWINGS

FIGS. 8A to 8D are a schematic cross-sectional view showing a method of manufacturing another conventional semiconductor device.

DETAILED DESCRIPTION OF THE PREFERRED EMBODIMENTS

First Embodiment

FIGS. 1A to 1C and FIGS. 2A and 2B are respectively schematic cross-sectional views showing a method of manufacturing a semiconductor device according to a first embodiment of the present invention in process order. The method of manufacturing the semiconductor device according to the first embodiment and its configuration will be described below based on FIGS. 1A to 1C and FIGS. 2A and 2B. Incidentally, a description of a process step for forming a gate oxide film and a gate electrode on an active region will be omitted in the following description for simplicity.

Figure 1A:
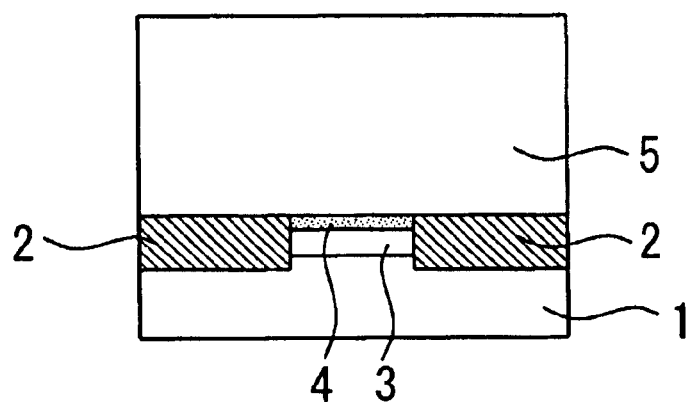
FIGS. 1A to 1C are respectively schematic cross-sectional views showing a method of manufacturing a semiconductor device according to a first embodiment of the present invention in process order.

As shown in FIG. 1A, element isolation regions 2 are first formed on a silicon semiconductor substrate 1 by the so-called shallow trench isolation (STI) method. Next, an impurity of conductivity type opposite to the silicon semiconductor substrate 1 is introduced into a surface layer of the silicon semiconductor substrate 1 to form a conductive layer (impurity diffusion layer) 3. A normally used cobalt silicide film 4 is formed on the conductive layer 3 as a contact layer. The conductive layer 3 serves as a source/drain diffusion layer. Thereafter, an interlayer insulating film 5 is formed over the whole surface of the silicon semiconductor substrate 1 by a CVD method.

Figure 1B:
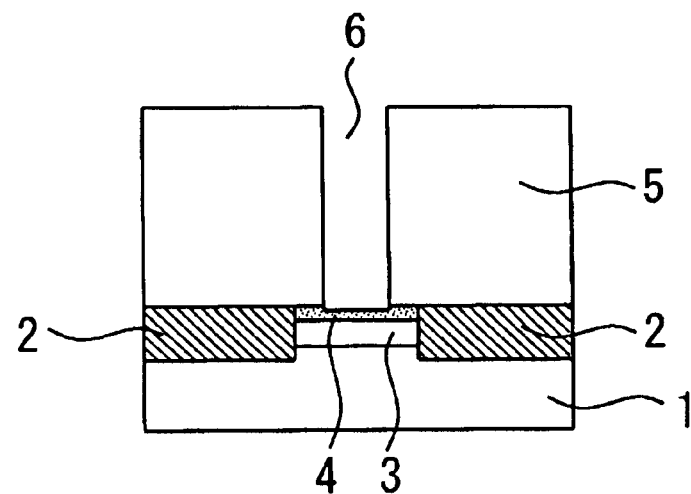

Next, as shown in FIG. 1B, the interlayer insulating film 5 is selectively etched to form a contact hole 6 which reaches the cobalt silicide film 4.

Figure 1C:
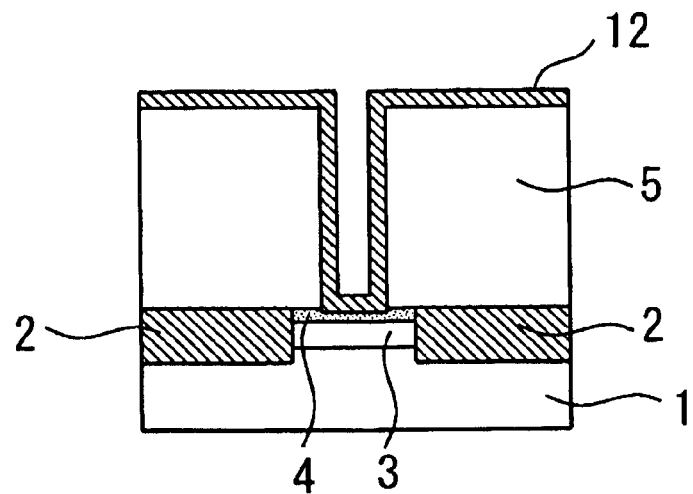

Next, as shown in FIG. 1C, a cobalt film 12 is formed so as to cover the interior of the contact hole 6 and the upper surface of the interlayer insulating film 5 by a sputtering method.

Figure 2A:
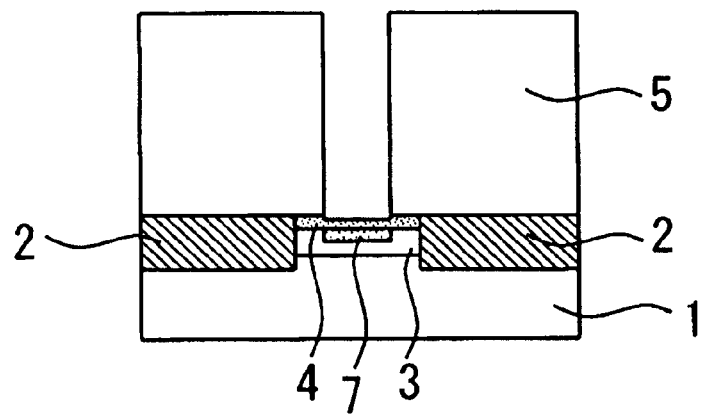
FIGS. 2A and 2B are respectively schematic cross-sectional views showing a method of manufacturing a semiconductor device according to a first embodiment of the present invention in process order.

Next, as shown in FIG. 2A, infrared anneal (rapid thermal anneal) is done under the condition of temperatures ranging from about 400° C. to about 550° C. to allow silicon of the conductive layer 3 to react with the cobalt film 12, thereby forming a cobalt silicide film 7. Thereafter, the unreacted cobalt film 12 is removed by a mixed solution of sulfuric acid and a hydrogen peroxide solution. Consequently, the cobalt silicide film 7 remains only at the bottom of the contact hole 6.

Forming the cobalt silicide film 7 on the conductive layer 3 newly in this way makes it possible to form the cobalt silicide film at the bottom of the contact hole 6 thicker in thickness than other regions. This is because cobalt in the cobalt film 12 is diffused from the cobalt silicide film 4 to the conductive layer 3 of the silicon semiconductor substrate 1 upon silicide reaction, and the lower surface of the cobalt silicide film 7 at the bottom of the contact hole 6 is positioned below the lower surface of the cobalt silicide film 4 other than the bottom of the contact hole 6. Thus, a contact resistance can be reduced at the bottom of the contact hole 6.

Figure 2B:
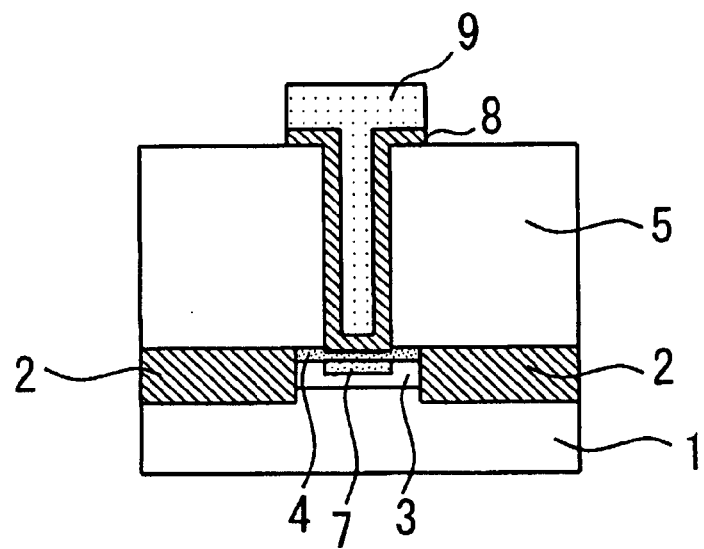

Next, as shown in FIG. 2B, deposition based on an inorganic CVD method using titanium tetrachloride ($TiCl_4$) is done under the condition of temperatures ranging from about 400° C. to about 600° C. to form a titanium film and a titanium nitride film in this order from the lower layer, thereby forming a barrier metal film 8 comprising a laminated film of these two films. Afterwards, a tungsten film 9 is formed by a CVD method using tungsten fluoride ($WF_6$) and an upper wiring formed of the barrier metal layer 8 and the tungsten film 9 is patterned on the interlayer insulating film 5.

According to the first embodiment as described above, the vertical position of the lower surface of the cobalt silicide film 7 at the bottom of the contact hole 6 can be set lower than the vertical position of the lower surface of the cobalt silicide film 4. It is therefore possible to reduce the contact resistance in the contact hole 6.

Since the cobalt silicide film 7 is formed after the formation of the contact hole 6, the thickness of the cobalt silicide film at the bottom of the contact hole 6 can be controlled. Thus, even if overetching occurs upon etching of the contact hole 6, the cobalt silicide film having a required thickness can be left at the bottom of the contact hole 6. Accordingly, the thickness of the cobalt silicide film at the bottom of the contact hole 6 can be determined without the amount of overetching at the formation of the contact hole 6 being subjected to limitations.

Further, the cobalt silicide film 7 can be formed only at the bottom of the contact hole 6 and provided so as not to be formed on side walls thereof. Thus, the inside diameter of the contact hole 6 is used to the full and thereby a conductive film used as a plug can be filled into the contact hole 6. Even if the contact hole 6 is of a micro one, a vertically direction resistance in the contact hole 6 can be reduced.

Second Embodiment

FIGS. 3A to 3C and FIGS. 4A to 4C are respectively schematic cross-sectional views showing a method of manufacturing a semiconductor device according to a second embodiment of the present invention in process order. The second embodiment is one in which the present invention is applied to a semiconductor device having a DRAM and logic combined. Contacts Reached from an upper layer are provided in a logic area 10 and a DRAM cell area 11 over a silicon semiconductor substrate 21. The method of manufacturing the semiconductor device according to the second embodiment and its configuration will be described below together based on FIGS. 3A to 3C and FIGS. 4A to 4C. Incidentally, a description about a process step for forming a gate oxide film and a gate electrode on an active region will be omitted in the following description for simplicity.

Figure 3A:
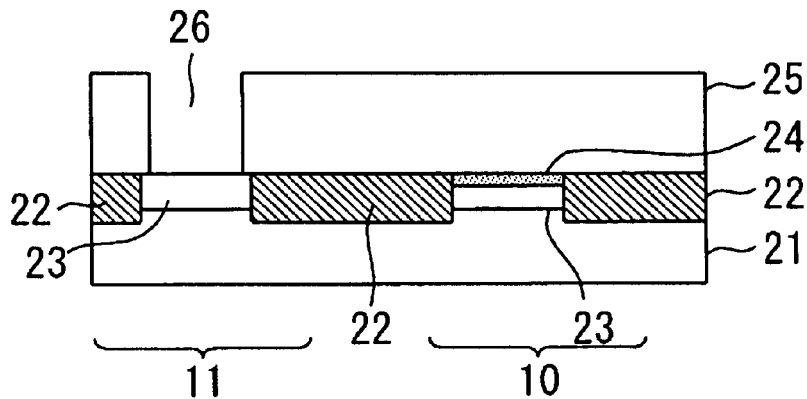
FIGS. 3A to 3C are respectively schematic cross-sectional views showing a method of manufacturing a semiconductor device according to a second embodiment of the present invention in process order.

As shown in FIG. 3A, element isolation regions 22 are first formed on the silicon semiconductor substrate 21 by the so-called shallow trench isolation method. Next, an impurity of conductivity type opposite to the silicon semiconductor substrate 21 is introduced into a surface layer of the silicon semiconductor substrate 21 to form conductive layers 23. The conductive layer 23 serves as a source/drain diffusion layer. In the logic area 10, a general cobalt silicide film 24 is formed on the conductive layer 23 as a contact layer. Thereafter, an interlayer insulating film 25 is formed over the whole surface of the silicon semiconductor substrate 21. In the DRAM cell area 11, part of the interlayer insulating film 25 is selectively etched to form a contact hole 26.

Figure 3B:
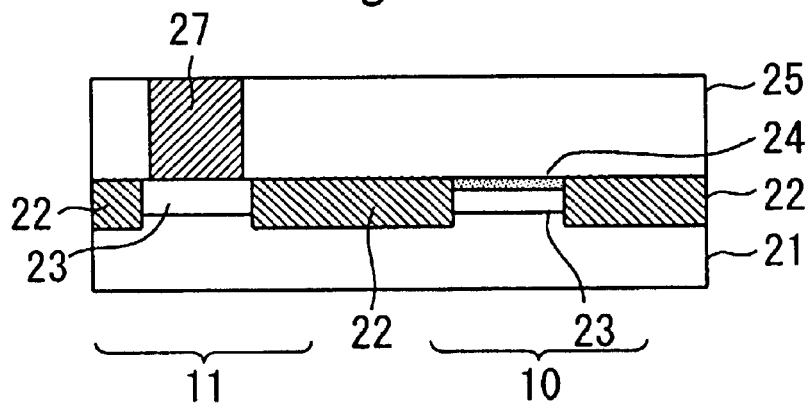

Next, as shown in FIG. 3B, a polycrystalline silicon film containing an impurity of the same conductivity type as the conductive film 23 is formed on the silicon semiconductor substrate 21 by a CVD method and buries the contact hole 26. Afterwards, the polycrystalline silicon film is removed on the interlayer insulating film 5 by a method such as an etchback method, a chemical mechanical polishing (CMP) method or the like to thereby form a silicon plug 27.

Figure 3C:
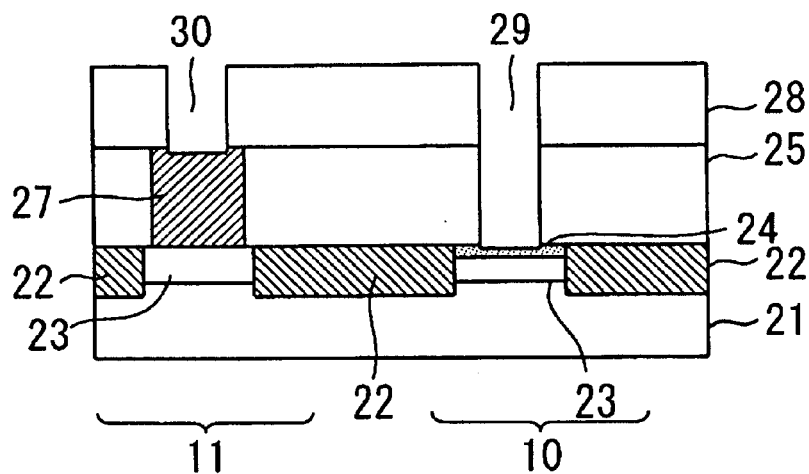

Next, as shown in FIG. 3C, an interlayer insulating film 28 is further formed on the interlayer insulating film 25 by the CVD method. Contact holes 29 and 30 are simultaneously formed on the logic area 10 and the DRAM cell area 11 by photolithography and dry etching subsequent to it. The contact hole 29 reaches the cobalt silicide film 24, whereas the contact hole 30 reaches the silicon plug 27.

Figure 4A:
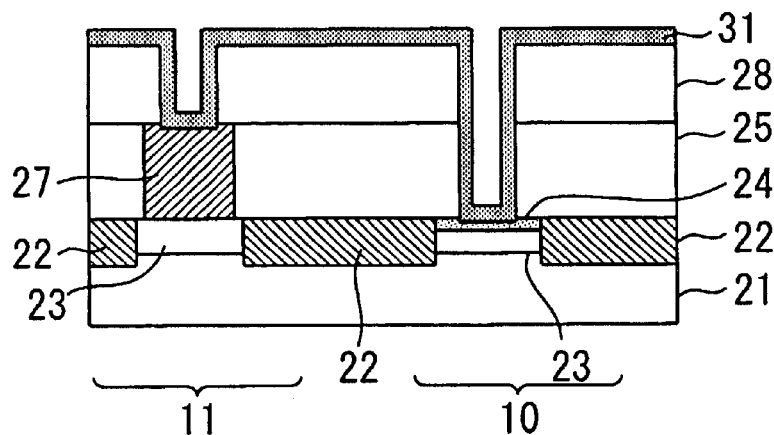
FIGS. 4A to 4C are respectively schematic cross-sectional views showing a method of manufacturing a semiconductor device according to a second embodiment of the present invention in process order.

Next, as shown in FIG. 4A, a cobalt film 31 is formed over the whole surface of the silicon semiconductor substrate 21 by a sputtering method. Thus, the cobalt film 31 covers the insides of the contact holes 29 and 30 and the upper surface of the interlayer insulating film 25.

Figure 4B:
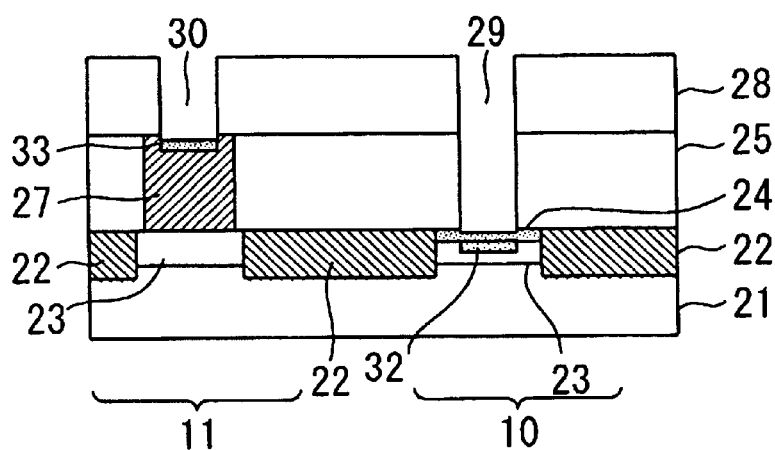

Next, as shown in FIG. 4B, infrared anneal is done under the condition of temperatures ranging from about 400° C. to about 550° C. Thus, silicon of the conductive layer 23 reacts with the cobalt film 31 in the logic area 10 to form a cobalt silicide film 32. In the DRAM area 11, silicon of the silicon plug 27 reacts with the cobalt 31 to form a cobalt silicide film 33.

Afterwards, the unreacted cobalt film 31 is removed by a mixed solution of sulfuric acid and a hydrogen peroxide solution. Consequently, the cobalt silicide films 32 and 33 remain only at the bottoms of the contact holes 29 and 30.

Thus, the vertical position of the lower surface of the cobalt silicide film 32 at the bottom of the contact hole 29 can be set lower than the vertical position of the lower surface of the cobalt silicide film 24 in the logic area 10 in a manner similar to the first embodiment. It is therefore possible to reduce the contact resistance in the contact hole 29.

Since the cobalt silicide film 32 is formed after the formation of the contact hole 29, the thickness of the cobalt silicide film at the bottom of the contact hole 29 can be controlled. Thus, even if overetching occurs upon etching of the contact hole 29, the cobalt silicide film having a required thickness can be left at the bottom of the contact hole 29. Accordingly, the thickness of the cobalt silicide film at the bottom of the contact hole 29 can be determined without the amount of overetching at the formation of the contact hole 29 being subjected to restrictions.

Figure 4C:
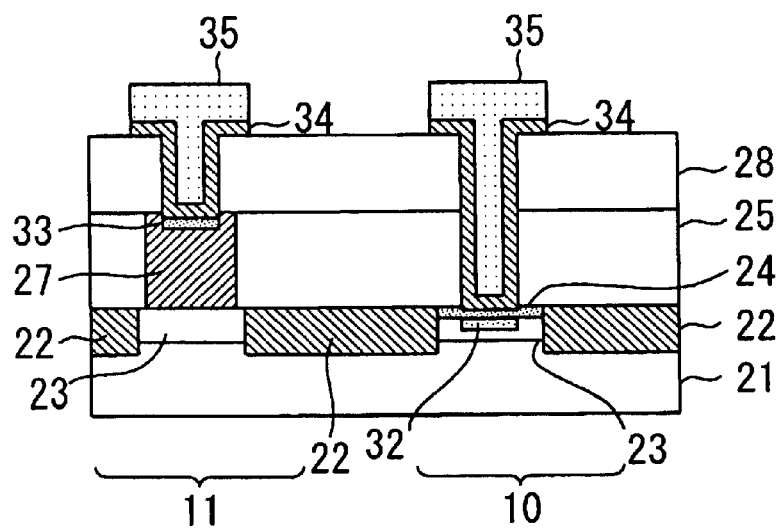

Next, as shown in FIG. 4C, deposition based on an inorganic CVD method using titanium tetrachloride is done under the condition of temperatures ranging from about 400° C. to about 600° C. to form a titanium film and a titanium nitride film on the silicon semiconductor substrate 21 in this order from the lower layer, thereby forming a barrier metal film 34 comprising a laminated film of these two films. Afterwards, a tungsten film 35 is formed by a CVD method using tungsten fluoride and an upper wiring formed of the barrier metal film 34 and the tungsten film 35 is patterned on the interlayer insulating film 28.

According to the second embodiment as described above, since the cobalt silicide film 33 is first formed and covers the upper surface of the silicon plug 27 when the barrier metal film 34 is formed on the silicon plug 27, the surface of the silicon plug 27 can be prevented from exposure. Thus, it is possible to prevent the silicon of the silicon plug 27 from reacting with the barrier metal film 34 upon formation of the barrier metal film 34.

Since the silicon plug 27 does not react with the barrier metal film 34, the missing of the polycrystalline silicon film can be prevented from occurring directly below the contact hole 30. It is thus possible to reliably prevent the contact hole 30 from being open.

Further, even when the contact hole is large in aspect ratio, the barrier metal film 34 can be grown by the inorganic CVD method under thermal stable conditions. Therefore, the barrier metal film 34 can be stably deposited within the contact hole 29 large in aspect ratio in particular. Thus, the resistance at the bottom of the contact hole 29 large in aspect ratio can be stabilized.

Since the barrier metal film 34 can be deposited by the inorganic CVD method under the thermal stable conditions, the barrier metal film 34 can be formed in common within the contact hole 29 large in aspect ratio and the contact hole 30 relatively small in aspect ratio. Accordingly, the barrier metal film 34 can be simultaneously formed within both the contact holes without going through a complicated manufacturing process, and the manufacturing process is simplified to thereby allow a reduction in cost. Thus, according to the second embodiment, the contact resistances can be reduced in both the logic area 10 and the DRAM cell area 11.

Third Embodiment

FIGS. 5A to 5C and FIGS. 6A to 6C are respectively schematic cross-sectional views showing a method of manufacturing a semiconductor device according to a third embodiment of the present invention in process order. The method of manufacturing the semiconductor device according to the third embodiment and its configuration will be described below together based on FIGS. 5 and 6. Incidentally, a description of a process step for forming a gate oxide film and a gate electrode on an active region will be omitted in the following description for simplicity.

Figure 5A:
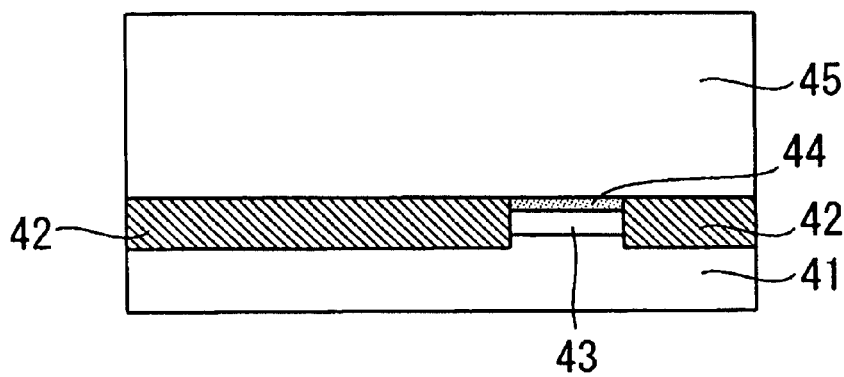
FIGS. 5A to 5C are respectively schematic cross-sectional views showing a method of manufacturing a semiconductor device according to a third embodiment of the present invention in process order.

As shown in FIG. 5A, element isolation regions 42 are first formed on a silicon semiconductor substrate 41 by the so-called shallow trench isolation method. Next, an impurity of conductivity type opposite to the silicon semiconductor substrate 41 is introduced into the silicon semiconductor substrate 41 from above to form a conductive layer 43. A normally used cobalt silicide film 44 is formed on the conductive layer 43 as a contact layer. The conductive layer 43 serves as a source/drain diffusion layer. Thereafter, an interlayer insulating film 45 is formed over the whole surface of the silicon semiconductor substrate 41 by a CVD method.

Figure 5B:
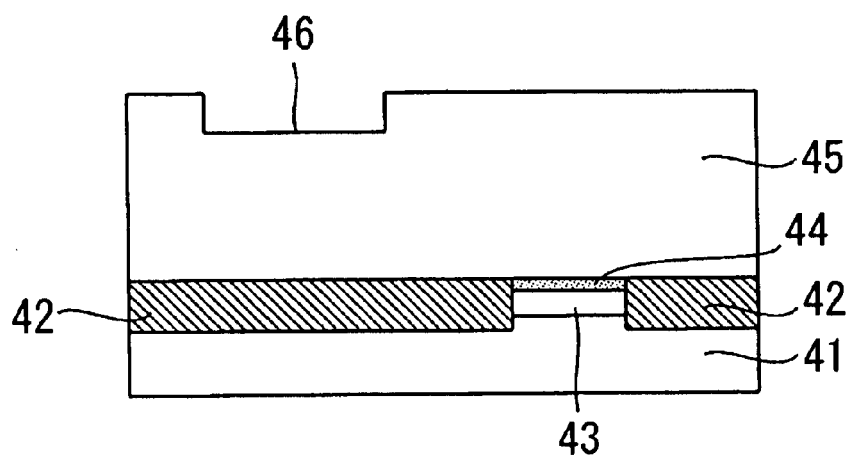

Next, as shown in FIG. 5B, the interlayer insulating film 45 is selectively etched to form a trench 46.

Figure 5C:
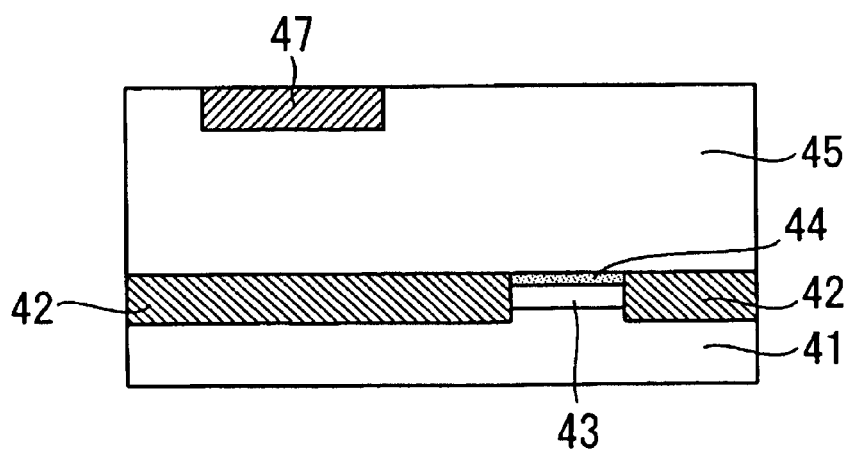

Next, as shown in FIG. 5C, a polycrystalline silicon film 47 is formed on the interlayer insulating film 45 by the CVD method and polished by a chemical mechanical polishing method. Consequently, the polycrystalline silicon film 47 is left only within the trench 46.

Figure 6A:
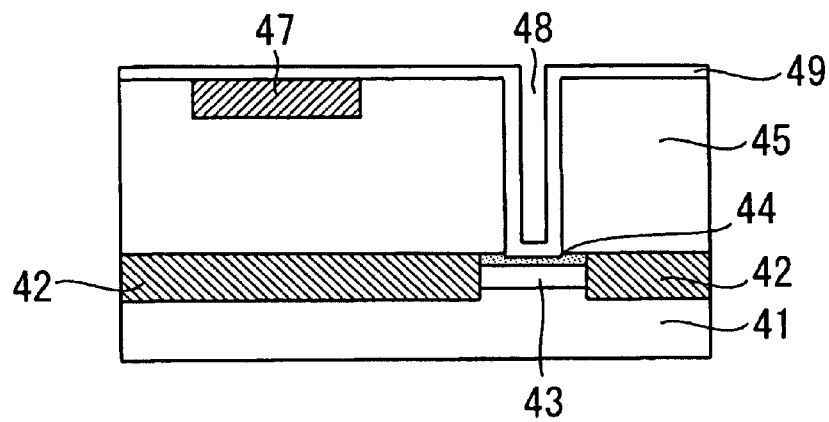
FIGS. 6A to 6C are respectively schematic cross-sectional views showing a method of manufacturing a semiconductor device according to a third embodiment of the present invention in process order.

Next, as shown in FIG. 6A, the interlayer insulating film 45 is selectively removed to form a contact hole 48 which reaches the cobalt silicide film 44. Afterwards, a cobalt film 49 is grown by a sputtering method. Consequently, the inside of the contact hole 48 and the surfaces of the interlayer insulating film 45 and polycrystalline film 47 are covered with the cobalt film 49.

Figure 6B:
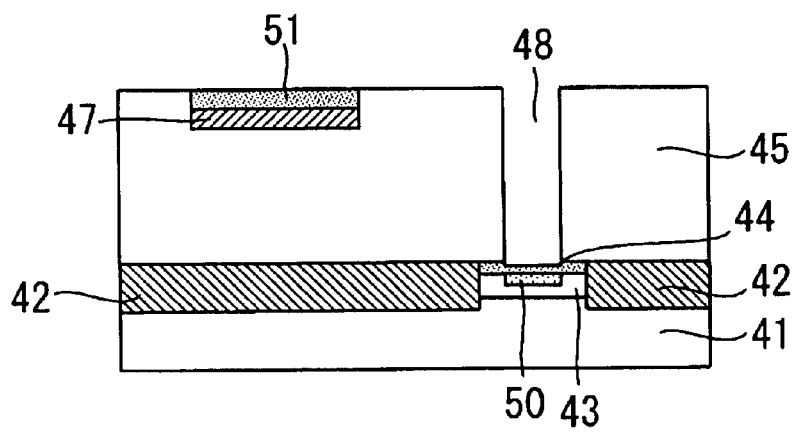

Next, as shown in FIG. 6B, infrared anneal is done under the condition of temperatures ranging from about 400° C. to about 550° C. Consequently, silicon of the conductive layer 43 reacts with the cobalt film 49 to thereby form a cobalt silicide film 50. Further, the polycrystalline silicon film 47 reacts with the cobalt film 49 to form a cobalt silicide film 51. Thereafter, the unreacted cobalt film 49 brought into no contact with the conductive layer 43 is removed by a mixed solution of sulfuric acid and a hydrogen peroxide solution. Consequently, the cobalt silicide films 50 and 51 remain only at the bottom of the contact hole 48 and on the polycrystalline silicon film 47.

Figure 6C:
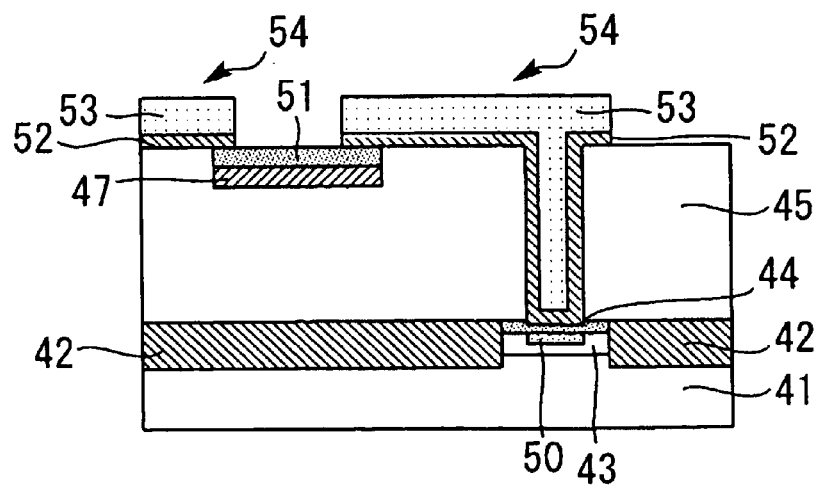
Figure 7A:
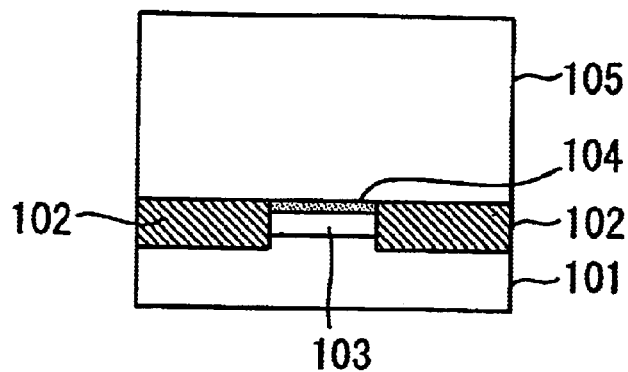
FIGS. 7A to 7C show a method of forming a contact plug connected to a source/drain diffusion layer of a MOS transistor, for example.
Figure 7B:
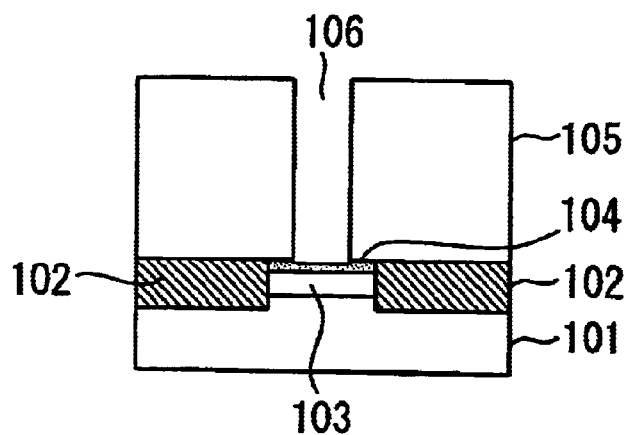
Figure 7C:
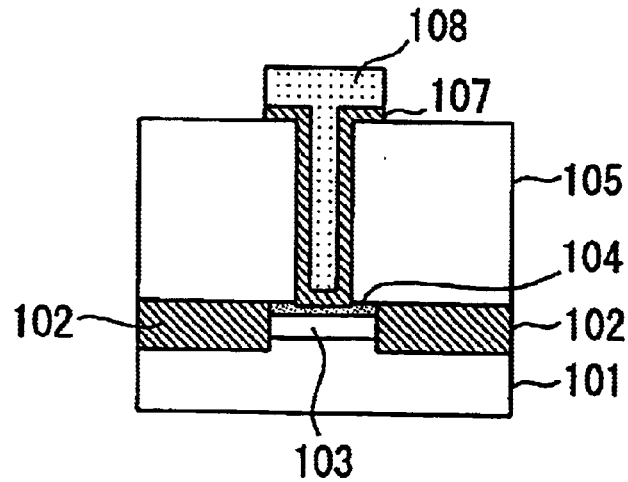

Next, as shown in FIG. 6C, deposition based on an inorganic CVD method using titanium tetrachloride is done under the condition of temperatures ranging from about 400° C. to about 600° C. to form a titanium film and a titanium nitride film on the silicon semiconductor substrate 41 in this order from the lower layer, thereby forming a barrier metal film 52 comprising a laminated film of these two films. Afterwards, a tungsten film 53 is formed by a CVD method using tungsten fluoride and upper wirings 54 formed of the barrier metal film 52 and the tungsten film 53 are patterned on the interlayer insulating film 45. At this time, the upper wirings 54 are patterned so as to be divided. They are electrically connected to each other by the cobalt silicide film 51. Thus, the two types of wiring films different in resistance value can be provided on the interlayer insulating film 45.

According to the third embodiment, the vertical position of the lower surface of the cobalt silicide film 50 at the bottom of the contact hole 48 can be set lower than the vertical position of the lower surface of the cobalt silicide film 44 in a manner similar to the first embodiment. It is therefore possible to reduce the contact resistance between the conductive layer 43 and the barrier metal film 52 at the bottom of the contact hole 48 and stabilize the resistance value thereof. Since the cobalt silicide film 50 is formed after the formation of the contact hole 48, the thickness of the cobalt silicide film at the bottom of the contact hole 48 can be controlled. Thus, even if overetching occurs upon etching of the contact hole 48, the cobalt silicide film having a required thickness can be left at the bottom of the contact hole 48. Accordingly, the thickness of the cobalt silicide film at the bottom of the contact hole 48 can be determined without the amount of overetching at the formation of the contact hole 48 being subjected to limitations.

Further, since the cobalt silicide film 51 is formed on the interlayer insulating film 45 in the third embodiment, the upper wirings 54 can be connected to each other without forming a further contact hole. Thus, the wiring films of the same layer can be made up of a plurality of wiring films respectively having different resistance values. A etching selection ratio of each of the upper wirings 54 to the cobalt silicide film 51 can easily be obtained upon etching for patterning the upper wirings 54.

Incidentally, other high melting-point metal films such as the titanium film or the tungsten film may be used as an alternative to the cobalt films 12, 31 and 49. In this case, an advantageous effect similar to the cobalt films 12, 31 and 49 can be obtained. Films obtained by silicidizing other high melting-point metal films such as the titanium film and the tungsten film may be used as an alternative to the cobalt silicide films 4, 24 and 44.

Since the present invention is constructed as described above, the following advantageous effects are brought about.

According to a semiconductor device of the present invention, the position of a lower surface of a second low resistance film at the bottom of a first opening is set lower than the position of a lower surface of the first low resistance film provided outside the first opening. Thus, even if overetching occurs upon etching of the first opening, the first and second low resistance films having a necessary thickness can be left at the bottom of the first opening. Consequently, a contact resistance in the first opening can be reduced.

The thickness of the first and second low resistance films at the bottom of the first opening is made different from that of the first low resistance film lying outside the first opening. Therefore, the first and second low resistance films having a necessary thickness can be left at the bottom of the first opening even if overetching is developed upon etching of the first opening. Thus, a contact resistance in the first opening can be reduced.

Since the thickness of the first and second low resistance films at the bottom of the first opening is made thicker than that of the first low resistance film lying outside the first opening, the first and second low resistance films having a necessary thickness can be left at the bottom of the first opening even if overetching occurs upon etching of the first opening. It is thus possible to reduce a contact resistance in the first opening.

Since a pad electrode and a second conductive film are electrically connected to each other via a third low resistance film formed on the pad electrode, the pad electrode can be prevented from reacting with the second conductive film, and missing of the pad electrode can be prevented from occurring.

Since an area in which a first impurity diffusion layer is formed, is defined as a logic area, and an area in which a second impurity diffusion layer is formed, is defined as a memory cell area, a contact resistance in the first opening can be reduced in the logic area, and missing of the pad electrode can be prevented from occurring in the memory cell area.

Owing to the formation of a first conductive film and a second conductive film on an insulating film as wiring patterns having the same thickness, the first and second conductive films can be formed in the same process. It is also possible to simplify the process and achieve a reduction in cost.

Owing to the formation of the first conductive film and the second conductive film on the insulating film as wiring patterns formed of the same material, the first and second conductive films can be formed in the same process. It is also possible to simplify the process and achieve a reduction in cost.

A fourth low resistance film is formed within a concave portion on the insulating film, the first conductive film is caused to extend over the fourth low resistance film, and the first conductive films separated from each other on the insulating film are electrically connected via the fourth low resistance film. Consequently, the first conductive films formed as patterns on the insulating film can be connected to each other without providing a contact hole. The fourth low resistance film and the first conductive film different in resistivity can be formed on the insulating film.

Since the first conductive film or the second conductive film is formed as a laminated film in which a barrier metal film and a high melting-point metal film are laminated in this order from a lower layer, the high melting-point metal film can be prevented from being diffused into other films.

According to a method of manufacturing a semiconductor device of the present invention, a first conductive film is caused to react with a semiconductor substrate after the formation of an opening to thereby form a second low resistance film below a first low resistance film. Therefore, even if overetching occurs upon etching of the opening, a low resistance film having a necessary thickness can be left at the bottom of the opening. It is thus possible to reduce a contact resistance in the opening.

Since the first low resistance film is formed as a silicide film and a silicide film used as the second low resistance film is formed by heat treatment, the silicide film can be continuously formed below the first low resistance film comprising silicide.

According to a method of manufacturing a semiconductor device of the present invention, a barrier metal film and a third conductive film formed on a third low resistance film are separated from each other within a region for the third low resistance film, the separated barrier metal film and third conductive film can electrically be connected to each other via the third low resistance film. Thus, the third low resistance film different in resistivity from a wiring layer comprising the barrier metal layer and the third conductive film can be provided on an insulating film.

According to a method of manufacturing a semiconductor device of the present invention, since a second low resistance film is formed below a first low resistance film in a first region and at the same time a third low resistance film is formed on a first conductive film in a second region, a contact resistance in a second opening can be reduced in the first region, and missing of a pad electrode formed of the first conductive film can be prevented from occurring in the second region.

Since the first low resistance film is formed as a silicide film and a silicide film is formed as the second low resistance film by heat treatment, the silicide film can be continuously formed below the first low resistance film formed of silicide. Further, since a second conductive film is formed as a high melting-point metal film and the first conductive film is formed as a polycrystalline silicon film, a silicide film used as the third low resistance film can be formed on the first conductive film by heat treatment.

Since a barrier metal film is formed using an inorganic CDV method, the barrier metal film can be reliably formed within the second opening large in aspect ratio.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-297499, filed on Sep. 27, 2001 including specification, claims, drawings and summary, on which the Convention priority of the present application is based, are incorporated herein by reference in its entirety.

What is claimed is:

1. A semiconductor device comprising:
   a first impurity diffusion layer formed in a surface layer of a semiconductor substrate;
   a first low resistance film which contains metal formed in a surface layer of said first impurity diffusion layer;
   an insulating film which covers said semiconductor substrate; and
   a first conductive film which fills in a first opening formed in said insulating film and is electrically connected to said first low resistance film; and
   a second low resistance film which contains metal formed beneath said first low resistance film and only at a bottom of said first opening, wherein a position of a lower surface of said second low resistance film at the bottom of said first opening is lower than a position of a lower surface of said first low resistance film provided outside said first opening.

2. The semiconductor device according to claim 1, wherein a thickness of said first and second low resistance films at the bottom of said first opening is different from the a thickness of said first low resistance film provided outside said first opening.

3. The semiconductor device according to claim 2, wherein the thickness of said first and second low resistance films at the bottom of said first opening is thicker than the thickness of said first low resistance film provided outside said first opening.

4. The semiconductor device according to claim 1, further comprising,
- a second impurity diffusion layer formed in a surface layer of said semiconductor substrate in a region different from a region in which said first impurity diffusion layer is formed;
- a pad electrode formed on said second impurity diffusion layer;
- a third low resistance film formed in a surface layer of said pad electrode; and
- a second conductive film formed on said pad electrode and electrically connected to said pad electrode via said third low resistance film.

5. The semiconductor device according to claim 4, wherein the region in which said first impurity diffusion layer is formed, is a logic area, and the region in which said second impurity diffusion layer is formed, is a memory cell area.

6. The semiconductor device according to claim 4, wherein said second conductive film is electrically connected to said pad electrode via a second opening formed in said insulating film, and wiring patterns each having the same thickness are respectively formed on said insulating film by said first conductive film and said second conductive film.

7. The semiconductor device according to claim 6, wherein said first conductive film and said second conductive film are formed of the same material.

8. The semiconductor device according to claim 1, further comprising a fourth low resistance film formed in a concave portion of the surface of said insulating film and different in resistivity from said first conductive film,
- wherein said first conductive film extends over said fourth low resistance film and said insulating film as a predetermined pattern, and
- said first conductive film including two films separated from each other on said fourth low resistance film and are electrically connected to each other via said fourth low resistance film.

9. The semiconductor device according to claim 1, wherein said first conductive film is a laminated film in which a barrier metal film and a high melting-point metal film are laminated in this order from a lower layer.

10. The semiconductor device according to claim 4, wherein said second conductive film is a laminated film in which a barrier metal film and a high melting-point metal film are laminated in this order from a lower surface.

* * * * *